United States Patent
Zhang et al.

(10) Patent No.: US 9,462,673 B2
(45) Date of Patent: Oct. 4, 2016

(54) HEAT SINK AND HEAT DISSIPATION SYSTEM

(71) Applicant: Huawei Technologies Co., Ltd., Shenzhen (CN)

(72) Inventors: Jun Zhang, Beijing (CN); Yongsheng Wang, Beijing (CN); Lu Cao, Shenzhen (CN)

(73) Assignee: Huawei Technologies Co., Ltd., Shenzhen (CN)

(*) Notice: Subject to any disclaimer, the term of this patent is extended or adjusted under 35 U.S.C. 154(b) by 58 days.

(21) Appl. No.: 14/570,080

(22) Filed: Dec. 15, 2014

(65) Prior Publication Data

US 2015/0173169 A1    Jun. 18, 2015

(30) Foreign Application Priority Data

Dec. 13, 2013 (CN) .......................... 2013 1 0687634

(51) Int. Cl.
*H05K 7/20* (2006.01)
*H05K 1/02* (2006.01)
*H01L 23/367* (2006.01)
*H01L 23/40* (2006.01)

(52) U.S. Cl.
CPC ......... *H05K 1/0203* (2013.01); *H01L 23/3675* (2013.01); *H01L 23/4006* (2013.01); *H01L 2224/16225* (2013.01); *H01L 2224/73253* (2013.01); *H01L 2924/0002* (2013.01)

(58) Field of Classification Search
CPC .............................. G06F 1/20; H05K 1/0203
USPC .......................... 361/712, 713, 715, 719, 720
See application file for complete search history.

(56) References Cited

U.S. PATENT DOCUMENTS

| | | | |
|---|---|---|---|
| 5,909,057 A | 6/1999 | McCormick et al. | |
| 6,014,315 A * | 1/2000 | McCullough | H01L 23/367 165/80.2 |
| 6,016,006 A * | 1/2000 | Kolman | H01L 21/54 257/712 |
| 6,281,573 B1 * | 8/2001 | Atwood | H01L 23/3675 165/80.3 |

(Continued)

FOREIGN PATENT DOCUMENTS

CN    202752157 U    2/2013

OTHER PUBLICATIONS

Foreign Communication From A Counterpart Application, European Application No. 14196220.9, Extended European Search Report dated Sep. 29, 2015, 12 page.

(Continued)

*Primary Examiner* — Anthony Haughton
(74) *Attorney, Agent, or Firm* — Conley Rose, P.C.; Grant Roolph (57) ABSTRACT

A heat sink, including a heat sink body and a filling material. A through hole is disposed in a position, corresponding to a to-be-cooled electronic element, on the heat sink body. The to-be-cooled electronic element is mounted on a circuit board and located between the circuit board and the heat sink body. There is a gap between the to-be-cooled electronic element and the heat sink body. The gap is connected to the through hole. The filling material is injected into the through hole and fills the gap. The present invention further discloses a heat dissipation system having the heat sink. The heat sink resolves problems in the prior art that, a heat sink has low thermal conduction efficiency and it is difficult to control a filling volume of a thermally conductive material in a gap between a heat sink and a chip.

20 Claims, 3 Drawing Sheets

(56) References Cited

U.S. PATENT DOCUMENTS

| | | | |
|---|---|---|---|
| 6,665,186 B1* | 12/2003 | Calmidi | H01L 23/16 165/80.4 |
| 7,295,433 B2* | 11/2007 | Taylor | H05K 7/20927 174/15.1 |
| 2002/0030972 A1* | 3/2002 | Ali | H01L 23/4006 361/704 |
| 2003/0183909 A1 | 10/2003 | Chiu | |
| 2005/0077614 A1* | 4/2005 | Chengalva | H01L 23/42 257/706 |
| 2008/0116586 A1 | 5/2008 | Kim et al. | |

OTHER PUBLICATIONS

Partial English Translation and Abstract of Chinese Patent Application No. CN202752157U, Mar. 2, 2015, 6 pages.

Foreign Communication From A Counterpart Application, European Application No. 14196220.9, Partial European Search Report dated Jun. 3, 2015, 6 pages.

* cited by examiner

HEAT SINK AND HEAT DISSIPATION SYSTEM

CROSS-REFERENCE TO RELATED APPLICATION

This application claims priority to Chinese Patent Application No. 201310687634.4, filed on Dec. 13, 2013, which is hereby incorporated by reference in its entirety.

TECHNICAL FIELD

The present invention relates to computer and microelectronics technologies, and in particular, to a heat sink and a heat dissipation system.

BACKGROUND

As microelectronics technologies develop, the degree of integration of electronic chips constantly increases, and power consumption of each electronic chip is getting increasingly high. Therefore, heat flux density on the electronic chip, such as a central processing unit (CPU) in a computer, is becoming increasingly high. In a practical application, in addition to the heat on an electronic chip that needs to be conducted out, in a board system including multiple electronic chips, it is also required to ensure that temperature may be distributed evenly at various positions on a board, so as to prevent the electronic chips or the board from being damaged by heat concentrated on one point. Therefore, in a practical engineering application, a heat dissipation apparatus is widely mounted on an electronic chip or in a position near the electronic chip, and is used to conduct heat on the electronic chip or a board.

However, different electronic chips are different in height, and each electronic chip has a thickness tolerance; therefore, in a production and processing process, thermally conductive materials with different thicknesses need to fill between a heat dissipation apparatus and an electronic chip, so as to enlarge a contact area between the heat dissipation apparatus and the electronic chip, thereby conducting out heat on the electronic chip. However, in the prior art, to compensate for the tolerance and meet a processing requirement, thermally conductive rubber pads with different thicknesses are required, which increases difficulty and costs of production and processing; in addition, these thermally conductive rubber pads have high thermal resistance, and are likely to be in poor contact with the electronic chip after a long period of use, causing low thermal conduction efficiency between the heat dissipation apparatus and the electronic chip. In addition, when a thermally conductive material fills between a heat dissipation apparatus and an electronic chip, there is a problem that it is difficult to control a filling volume of the thermally conductive material. An excessive volume of the thermally conductive material easily causes overflow, an insufficient volume of the thermally conductive material causes poor heat dissipation, and a sufficient volume of the thermally conductive material cannot be adaptively used for filling.

SUMMARY

An embodiment of the present invention provides a heat sink, which may resolve a problem in the prior art that it is difficult to control a filling volume of a thermally conductive material in a gap between a heat sink and a chip.

In addition, an embodiment of the present invention further provides a heat dissipation system having the foregoing heat sink.

To resolve the foregoing technical problem, the present invention provides a heat sink, including a heat sink body and a filling material, where a through hole is disposed in a position, corresponding to a to-be-cooled electronic element, on the heat sink body, the to-be-cooled electronic element is mounted on a circuit board and located between the circuit board and the heat sink body, there is a gap between the to-be-cooled electronic element and the heat sink body, the gap is connected to the through hole, and the filling material is injected into the through hole and fills the gap.

The filling material is a thermally conductive material, which may be any one of thermally conductive silicone grease, gel, silica gel, and metallic liquid.

The heat sink further includes an adjusting member, and the adjusting member is moved in or out of the through hole to adjust density of the filling material in the gap.

The filling material is metallic liquid. The heat sink further includes several thermally conductive rubber rings, where the thermally conductive rubber ring sleeves the to-be-cooled electronic element peripherally, an upper surface of the thermally conductive rubber ring is higher than a surface of the to-be-cooled electronic element, the heat sink body is pressed against the upper surface of the thermally conductive rubber ring, and the filling material is located in the gap and surrounded by the thermally conductive rubber ring.

The filling material is metallic liquid. The heat sink further includes several thermally conductive rubber rings, where the thermally conductive rubber ring is placed on an outside edge of a surface of the to-be-cooled electronic element, the heat sink body presses the thermally conductive rubber ring against the surface of the electronic element, and the filling material is located in the gap and surrounded by the rubber ring.

The through hole includes several injection holes, and the injection holes are connected to the gap.

The several injection holes are evenly distributed above the gap; the filling material evenly fills the gap through the several injection holes of the through hole.

The heat sink further includes several connecting members, and the connecting members detachably fasten the heat sink body to the circuit board.

The heat sink further includes several cooling fins, and the cooling fins are mounted on an outer side of the heat sink body.

The present invention further provides a heat dissipation system, which includes a circuit board and the foregoing heat sink, where the heat sink is configured to perform heat dissipation on an electronic element on the circuit board.

In conclusion, the heat sink provided by the embodiments of the present invention has a simple structure. The filling material may adaptively fill the gap between the heat sink body and the corresponding to-be-cooled electronic element according to properties of the filling material and pressure, so that the heat sink body may be in sufficient contact with the to-be-cooled electronic element. Therefore, heat generated when the to-be-cooled electronic element operates is conducted to an external environment in a timely manner, which effectively resolves a problem in the prior art that it is difficult to control a filling volume of a thermally conductive material in a gap between a heat sink and a chip. In addition, the heat sink has high thermal conduction efficiency, thus an increase in the number of electronic elements sharing the heat sink does not cause larger mechanical pressure to the electronic elements.

BRIEF DESCRIPTION OF DRAWINGS

To describe the technical solutions in the embodiments of the present invention more clearly, the following briefly introduces the accompanying drawings required for describing the embodiments or the prior art. The accompanying drawings in the following description show merely some embodiments of the present invention, and a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. The described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
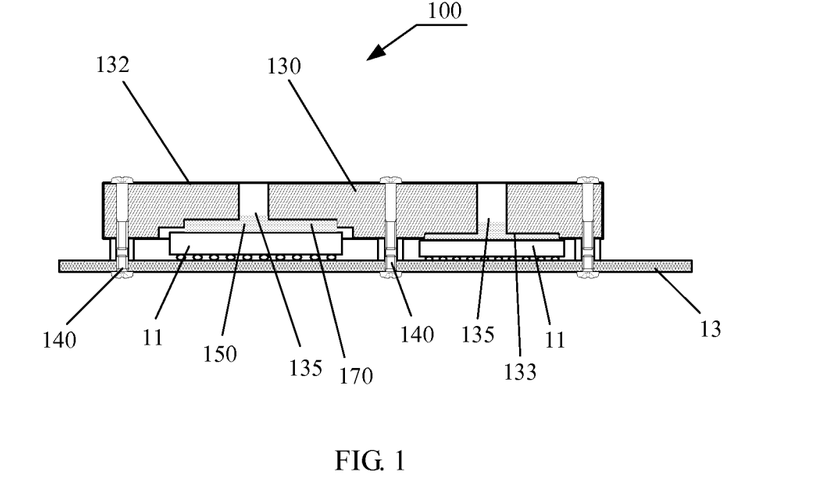
FIG. 1 is a sectional view of a heat sink according to an embodiment of the present invention.

Referring to FIG. 1, FIG. 1 is a sectional view of a heat sink 100 according to an embodiment of the present invention. The heat sink 100 is configured to perform heat dissipation on a to-be-cooled electronic element 11, where the to-be-cooled electronic element 11 is mounted on a circuit board 13, and is electrically connected to the circuit board 13. The circuit board 13 and the heat sink 100 form a heat dissipation system.

The circuit board 13 may be a printed circuit board (PCB). The to-be-cooled electronic element 11 includes a CPU, an integrated circuit, a chipset, and the like.

The heat sink 100 includes a heat sink body 130 and a filling material 150.

The heat sink body 130 as a whole is substantially in a shape of a cuboid, and several through holes 135 are disposed on the heat sink body 130. The through hole 135 extends from an outer side 132 of the heat sink body 130 to an inner side 133 of the heat sink body 130, and runs through the heat sink body 130. The to-be-cooled electronic element 11 is located between the circuit board 13 and the heat sink body 130, and the through hole 135 is disposed above the to-be-cooled electronic element 11, and aligned with a position in which the to-be-cooled electronic element 11 is mounted. Different to-be-cooled electronic elements are different in height, and each to-be-cooled electronic element has a thickness tolerance; therefore, there is a gap 170 between the heat sink body 130 and the to-be-cooled electronic element 11. Further, the gap 170 exists between the inner side 133 of the heat sink body 130 and the to-be-cooled electronic element 11. The gap 170 is connected to the through hole 135. The filling material 150 may fill the gap 170 through the through hole 135.

In the embodiment of the present invention, the heat sink body 130 may be made of a metal material, for example, copper, aluminum or a copper-aluminum alloy.

The heat sink body 130 shown in FIG. 1 is of a structure in a shape of a cuboid, which is exemplary. Certainly, as long as the objective of the present invention can be achieved, the heat sink body 130 is not limited to having a rectangular cross section, and may also have a cross section being circular, trapezoidal or in another shape. Preferably, in this embodiment of the present invention, a shape of the heat sink body 130 is consistent with a shape of the circuit board 13.

Optionally, as shown in FIG. 1, the heat sink 100 further includes several connecting members 140.

The heat sink body 130 is detachably fastened to the circuit board 13 using the several connecting members 140.

The several connecting members 140 are metal pieces, which may be made of steel.

In this embodiment of the present invention, the connecting member 140 may be a stud, by means of which the heat sink body 130 is detachably mounted on and fastened to the circuit board 13 in a threaded connection manner.

Figure 2:
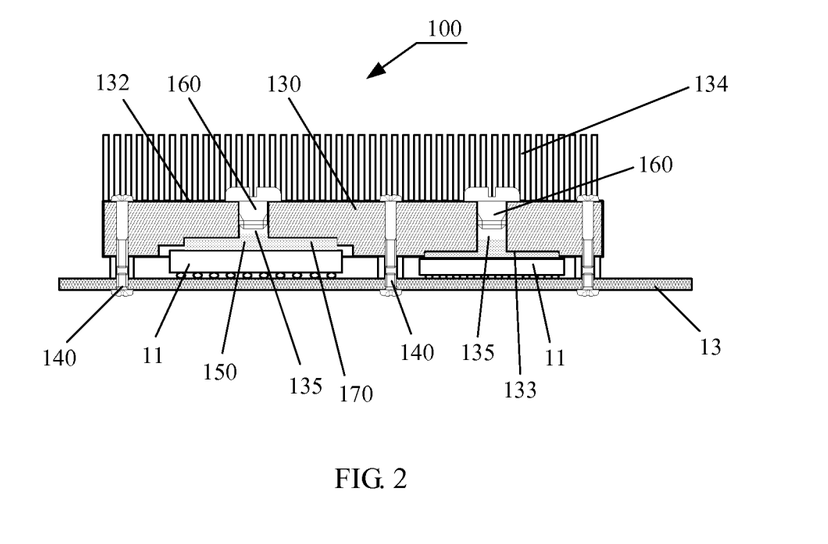
FIG. 2 is a sectional view of another heat sink according to an embodiment of the present invention.

Further optionally, as shown in FIG. 2, the heat sink 100 further includes several adjusting members 160.

The adjusting member 160 may be moved in or out of the through hole 135 of the heat sink body 130, so as to prevent the filling material 150 from flowing out of the through hole 135 of the heat sink body 130, or be configured to inject the filling material 150 into the through hole 135 of the heat sink body 130, and make the filling material 150 fill the gap 170.

The several adjusting members 160 are metal pieces, which may be made of steel. In this embodiment of the present invention, the adjusting member 160 may be a screw, which may be screwed in or out of the through hole 135, where the depth to which the screw is screwed in the through hole 135 may be adjusted, so as to adjust density of the filling material 150 in the gap 170. When the filling material 150 is injected into the through hole 135, the adjusting member 160 is screwed in the through hole 135, and the depth to which the adjusting member 160 is screwed in the through hole 135 is adjusted to press the filling material 150, which may enable the filling material 150 to sufficiently permeate and fill the gap 170 between the heat sink body 130 and the corresponding to-be-cooled electronic element 11, so that the heat sink body 130 is in sufficient contact with the to-be-cooled electronic element 11, and therefore heat generated when the to-be-cooled electronic element 11 operates is conducted out in a timely manner. Therefore, the heat sink 100 has relatively high thermal conduction efficiency.

Further optionally, as shown in FIG. 2, the heat sink 100 further includes several cooling fins 134. The cooling fins 134 are located on the outer side 132 of the heat sink body 130, and configured to provide a larger air contact area, so that the heat generated when the to-be-cooled electronic element 11 operates is conducted out in a timely manner.

In this embodiment of the present invention, preferably, the filling material 150 is a thermally conductive material having certain flowability, which includes, but is not limited to, thermally conductive silicone grease, gel or silica gel. The thermally conductive material having flowability is injected into the through hole 135, and may fill the gap 170 between the heat sink body 130 and the to-be-cooled electronic element 11 through the through hole 135, so that the heat sink body 130 is in sufficient contact with the to-be-cooled electronic element 11, and therefore, the heat generated when the to-be-cooled electronic element 11 operates is conducted to an external environment in a timely manner, which helps improve thermal conduction efficiency of the heat sink 100.

It may be understood that, density of the thermally conductive material that fills the through hole 135 may be controlled by torque that moves the adjusting member 160 in. Large torque may lead to filling a large volume of the thermally conductive material and lead to high density; on the contrary, small torque may lead to filling a small volume of the thermally conductive material and lead to low density. According to a volume of the gap 170 in a maximum tolerance situation, the injected thermally conductive material does not flow out as long as the injected thermally conductive material does not exceed the volume. In addition, the filling material 150 has certain viscosity, and therefore, when the filling material 150 diffuses on a surface of the to-be-cooled electronic element 11 under the action of pressure of the adjusting member 160, resulting flow resistance increases correspondingly due to an increasing diffusion area, and eventually a balance between the flow resistance and the pressure of the adjusting member 160 is reached. Therefore, the pressure applied by the adjusting member 160 may control the diffusion area of the filling material 150. Correspondingly, a larger diffusion area of the filling material 150 leads to more sufficient contact between the heat sink body 130 and the to-be-cooled electronic element 11, which better facilitates conduction of the heat generated when the to-be-cooled electronic element 11 operates.

The heat sink 100 provided by this embodiment of the present invention has a simple structure. The filling material may adaptively fill the gap 170 between the heat sink body 130 and the corresponding to-be-cooled electronic element 11 according to properties of the filling material and pressure, so that the heat sink body 130 may be in sufficient contact with the to-be-cooled electronic element 11. Therefore, heat generated when the to-be-cooled electronic element 11 operates is conducted to an external environment in a timely manner. In addition, the heat sink 100 has high thermal conduction efficiency, and an increase in the number of electronic elements sharing the heat sink 100 does not cause larger mechanical pressure to the electronic elements.

Figure 3:
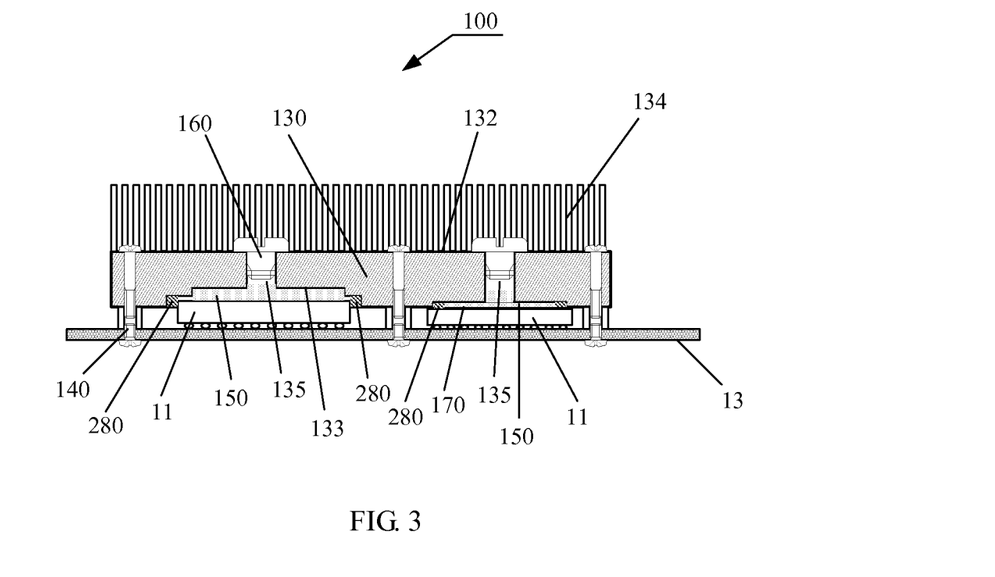
FIG. 3 is a sectional view of still another heat sink according to an embodiment of the present invention.

Further, referring to FIG. 3, the heat sink 100 may further include several thermally conductive rubber rings 280.

The thermally conductive rubber ring 280 may be made by cutting and clipping a thermally conductive rubber pad. The thermally conductive rubber ring 280 has a thermal conduction function, and is elastic. The thermally conductive rubber ring 280 is of a closed ring structure.

The thermally conductive rubber ring 280 provided in this embodiment of the present invention is of a structure in the shape of a rectangular ring, which is exemplary. Certainly, as long as the objective of the present invention can be achieved, the thermally conductive rubber ring 280 is not limited to be in the shape of a rectangular ring, and may also be in the shape of a circular ring, an oval ring, or a trapezoidal ring or in another shape. Preferably, in this embodiment of the present invention, the shape and the size of the thermally conductive rubber ring 280 are consistent with the shape and the size of the to-be-cooled electronic element 11.

The thermally conductive rubber ring 280 may sleeve the to-be-cooled electronic element 11 peripherally, and an upper surface of the thermally conductive rubber ring 280 is higher than the surface of the to-be-cooled electronic element 11. The heat sink body 130 is pressed against the upper surface of the thermally conductive rubber ring 280, and the filling material 150 is restrained in the gap 170 and surrounded by the thermally conductive rubber ring 280, so as to prevent the filling material 150 from overflowing onto the circuit board 13. Because the thermally conductive rubber ring 280 is elastic, the thermally conductive rubber ring 280 is fastened peripherally to the to-be-cooled electronic element 11 by means of elastic deformation, and the upper surface of the thermally conductive rubber ring 280 is firmly pressed by the heat sink body 130.

The thermally conductive rubber ring 280 may also be directly placed on an outside edge of the surface of the to-be-cooled electronic element 11. Because the rubber ring 280 is elastic, the heat sink body 130 may firmly press the thermally conductive rubber ring 280 on the surface of the to-be-cooled electronic element 11, and the filling material 150 is restrained in the gap 170 and surrounded by the thermally conductive rubber ring 280, so as to prevent the filling material 150 from overflowing onto the circuit board 13. In addition, because the thermally conductive rubber ring 280 further has the thermal conduction function, the thermally conductive rubber ring 280 may also conduct out in a timely manner the heat generated when the to-be-cooled electronic element 11 operates, which helps improve thermal conduction efficiency of the heat sink 100.

Further, the thermally conductive rubber ring 280 is sticky, so that the thermally conductive rubber ring 280 may be stuck to the to-be-cooled electronic element 11 peripherally, or be directly stuck to the outside edge of the surface of the to-be-cooled electronic element 11. The thermally conductive rubber ring 280 is first stuck and fastened to the to-be-cooled electronic element 11 peripherally, where the upper surface of the thermally conductive rubber ring 280 is higher than the surface of the to-be-cooled electronic element 11, or is directly stuck to the outside edge of the surface of the to-be-cooled electronic element 11, and then the heat sink body 130 firmly presses the thermally conductive rubber ring 280.

In addition, the thermally conductive rubber ring 280 may also be first stuck to a bottom of the heat sink body 130, and then, the thermally conductive rubber ring 280 together with the heat sink body 130 sleeves the to-be-cooled electronic element 11 peripherally, causing the upper surface of the thermally conductive rubber ring 280 to be higher than the surface of the to-be-cooled electronic element 11, or may be directly placed on the outside edge of the surface of the to-be-cooled electronic element 11. This embodiment is described using a mounting manner of directly sticking the thermally conductive rubber ring 280 to the outside edge of the surface of the to-be-cooled electronic element 11 as an example.

Correspondingly, as shown in FIG. 3, when the heat sink 100 includes the thermally conductive rubber ring 280, the filling material 150 may be a thermally conductive material having greater flowability, for example, metallic liquid. Because the thermally conductive rubber ring 280 is firmly pressed on the surface of the to-be-cooled electronic element 11 by the heat sink body 130, the filling material 150 may be prevented from overflowing onto the circuit board 13. Based on that the thermally conductive material has greater flowability, the liquid thermally conductive material adaptively fills the gap 170 using weight of the liquid thermally conductive material, and an injection process is simple and convenient, thereby improving production and processing efficiency. In addition, it may be observed using the through hole 135 whether the gap 170 is filled with the filling material 150, thereby avoiding a problem that an excessive or insufficient volume of filling material fills the gap 170.

Correspondingly, the adjusting member 160 may be a screw or a sealing plug, which is not limited herein, as long as the through hole 135 can be sealed.

In addition, a pressure syringe may further be used to press the filling material into the gap 170 according to preset pressure, and consequently, the heat sink body 130 is in sufficient contact with the to-be-cooled electronic element 11. Therefore, the heat generated when the to-be-cooled electronic element 11 operates is conducted out in a timely manner, which helps improve thermal conduction efficiency of the heat sink 100.

Figure 4:
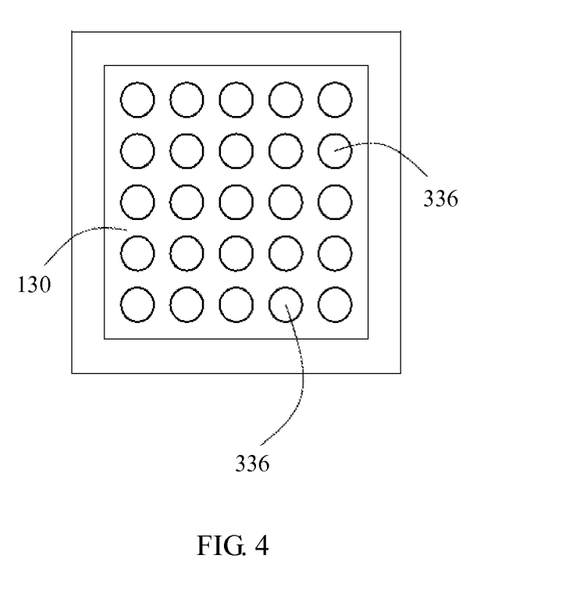
FIG. 4 is a bottom view of a heat sink body according to the present invention.
Figure 5:
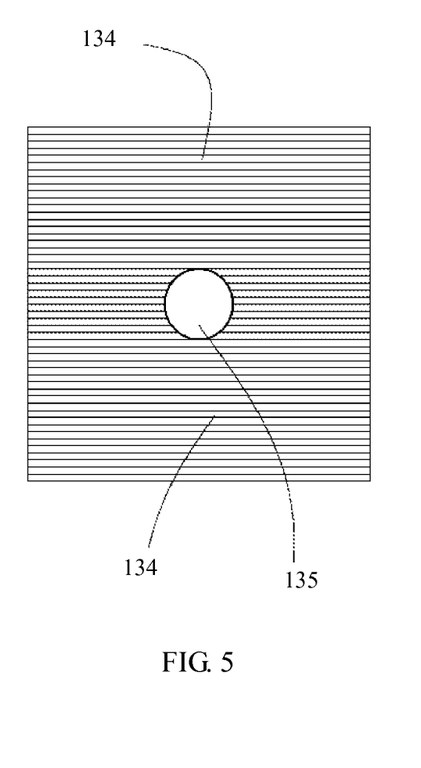
FIG. 5 is a top view of the heat sink body that is shown in FIG. 4 and provided with a heat dissipation piece.

Further optionally, referring to FIG. 4 and FIG. 5, the through hole 135 includes several injection holes 336, where the injection holes 336 are connected to the gap 170. The filling material 150 may be injected into the gap 170 through the injection holes 336, and distributed on the surface of the to-be-cooled electronic element 11. Further, the several injection holes 336 may be evenly distributed above the gap 170. Based on this, the filling material 150 may evenly fill the gap 170 through the injection holes 336, and consequently, the heat sink body 130 is in sufficient and even contact with the to-be-cooled electronic element 11. Therefore, the heat generated when the to-be-cooled electronic element 11 operates is conducted out in a timely manner, which improves heat dissipation efficiency.

It may be understood that in an exemplary embodiment of the present invention, the filling material 150 is not limited to be a thermally conductive material having certain flowability, and may also be a thermally conductive material having bonding and curing functions. In this way, after the thermally conductive material fills the gap 170 and is cured, the heat sink body 130 and the to-be-cooled electronic element 11 may be bonded to each other and therefore be in more sufficient contact with each other, so that the heat generated when the to-be-cooled electronic element 11 operates is conducted out in a timely manner. In addition, because the filling material 150 has the bonding and curing functions, pressing and sealing performed by the adjusting member 160 are not required, and the adjusting member 160 may be omitted.

In conclusion, the heat sink 100 provided by this embodiment of the present invention has a simple structure. The filling material may adaptively fill the gap 170 between the heat sink body 130 and the corresponding to-be-cooled electronic element 11 according to properties of the filling material and pressure, so that the heat sink body 130 may be in sufficient contact with the to-be-cooled electronic element 11. Therefore, heat generated when the to-be-cooled electronic element 11 operates is conducted to an external environment in a timely manner, which effectively resolves a problem in the prior art that it is difficult to control a filling volume of a thermally conductive material in a gap between a heat sink and a chip. In addition, the heat sink 100 has high thermal conduction efficiency, and an increase in the number of electronic elements sharing the heat sink 100 does not cause larger mechanical pressure to the electronic elements.

In the embodiment of the present invention, the heat sink 100 may be a conjoined heat sink, and configured to perform heat dissipation on more than one electronic element. The heat sink 100 may also be an independent heat sink, and configured to perform heat dissipation on one electronic element.

An embodiment of the present invention further provides a heat dissipation system, including a circuit board and the heat sink according to any embodiment of FIG. 1 to FIG. 3 of the present invention.

The heat sink is configured to perform heat dissipation on an electronic element on the circuit board. For a specific structure and implementation principles of the heat sink, refer to any embodiment of FIG. 1 to FIG. 3 of the present invention.

In conclusion, in a heat dissipation system according to the embodiment of the present invention, for the heat sink 100, a filling material may adaptively fill a gap 170 between the heat sink body 130 and a corresponding to-be-cooled electronic element according to properties of the filling material and pressure, so that the heat sink body 130 may be in sufficient contact with the to-be-cooled electronic element on a circuit board. Therefore, heat generated when the to-be-cooled electronic element operates is conducted to an external environment in a timely manner, which effectively resolves a problem in the prior art that it is difficult to control a filling volume of a thermally conductive material in a gap between a heat sink and a chip. In addition, the heat dissipation system has high thermal conduction efficiency, and an increase in the number of electronic elements sharing the heat sink 100 does not cause larger mechanical pressure to the electronic elements.

Finally, it should be noted that the foregoing embodiments are merely intended for describing the technical solutions of the present invention, but not for limiting the present invention. Although the present invention is described in detail with reference to the foregoing embodiments, a person of ordinary skill in the art should understand that the descriptions are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A heat sink comprising:
   a heat sink body;
   a thermally conductive rubber ring; and
   a filling material,
   wherein a through hole is disposed in a position on the heat sink body corresponding to a to-be-cooled electronic element,
   wherein the to-be-cooled electronic element is mounted on a circuit board and located between the circuit board and the heat sink body,
   wherein the thermally conductive rubber ring is placed on an outside edge of a surface of the to-be-cooled electronic element,
   wherein the heat sink body presses the thermally conductive rubber ring against the surface of the to-be-cooled electronic element,
   wherein there is a gap between the to-be-cooled electronic element and the heat sink body,
   wherein the gap is connected to the through hole, and
   wherein the filling material is injected into the through hole and fills the gap.

2. The heat sink according to claim 1, wherein the filling material is a thermally conductive material including at least one of thermally conductive silicone grease, gel, silica gel, and metallic liquid.

3. The heat sink according to claim 1, wherein the heat sink further comprises an adjusting member, and wherein the adjusting member is moved in or out of the through hole to adjust density of the filling material in the gap.

4. The heat sink according to claim 1, wherein the filling material is metallic liquid, wherein the thermally conductive rubber ring sleeve the to-be-cooled electronic element peripherally, wherein an upper surface of the thermally conductive rubber ring is higher than the surface of the to-be-cooled electronic element, wherein the heat sink body is pressed against the upper surface of the thermally conductive rubber ring, and wherein the filling material is located in the gap and surrounded by the thermally conductive rubber ring.

5. The heat sink according to claim 4, wherein the through hole comprises a plurality of injection holes, and wherein the injection holes are connected to the gap.

6. The heat sink according to claim 5, wherein the injection holes are evenly distributed above the gap, wherein the filling material is received through the injection holes of the through hole, and wherein the filling material evenly fills the gap.

7. The heat sink according to claim 1, wherein the filling material is metallic liquid and wherein the filling material is located in the gap and surrounded by the thermally conductive rubber ring.

8. The heat sink according to claim 7, wherein the through hole comprises a plurality of injection holes, and wherein the injection holes are connected to the gap.

9. The heat sink according to claim 8, wherein the injection holes are evenly distributed above the gap, and wherein the filling material evenly fills the gap.

10. The heat sink according to claim 1, wherein the heat sink further comprises a plurality of connecting members, and wherein the connecting members detachably fasten the heat sink body to the circuit board.

11. The heat sink according to claim 1, wherein the heat sink further comprises a plurality of cooling fins, and wherein the cooling fins are mounted on an outer side of the heat sink body.

12. A heat dissipation system comprising:
a circuit board; and
a heat sink comprising:
a heat sink body;
a thermally conductive rubber ring; and
a filling material,
wherein the heat sink is configured to perform heat dissipation on an electronic element on the circuit board,
wherein the thermally conductive rubber ring is placed on an outside edge of a surface of the electronic element, and
wherein the heat sink body presses the thermally conductive rubber ring against the surface of the to-be-cooled electronic element.

13. The heat dissipation system according to claim 12, wherein the heat sink comprises a through hole, wherein the through is on the heat sink body and disposed in a position corresponding to the electronic element, wherein the electronic element is located between the circuit board and the heat sink body, wherein there is a gap between the electronic element and the heat sink body, wherein the gap is connected to the through hole, and wherein the filling material is injected into the through hole and fills the gap.

14. The heat dissipation system according to claim 12, wherein the filling material is a thermally conductive material including at least one of a thermally conductive silicone grease, gel, silica gel, and metallic liquid.

15. The heat dissipation system according to claim 12, wherein the filling material is metallic liquid, wherein the thermally conductive rubber ring sleeves the electronic element peripherally, wherein an upper surface of the thermally conductive rubber ring is higher than the surface of the electronic element, wherein the heat sink body is pressed against the upper surface of the thermally conductive rubber ring, and wherein the filling material is located in the gap and surrounded by the thermally conductive rubber ring.

16. The heat dissipation system according to claim 15, wherein the through hole comprises a plurality of injection holes, wherein the injection holes are connected to the gap, wherein the injection holes are evenly distributed above the gap, wherein the filling material is received through the injection holes, and wherein the filling material evenly fills the gap.

17. The heat dissipation system according to claim 13, wherein the filling material is metallic liquid, and wherein the filling material is located in the gap and surrounded by the thermally conductive rubber ring.

18. The heat dissipation system according to claim 17, wherein the through hole comprises a plurality of injection holes, wherein the injection holes are connected to the gap, wherein the injection holes are evenly distributed above the gap, and wherein the filling material is received through the injection holes of the through hole, and wherein the filling material evenly fills the gap.

19. The heat dissipation system according to claim 12, wherein the heat sink further comprises a plurality of connecting members, and wherein the connecting members detachably fasten the heat sink body to the circuit board.

20. The heat dissipation system according to claim 12, wherein the heat sink further comprises a plurality of cooling fins, and wherein the cooling fins are mounted on an outer side of the heat sink body.

* * * * *

UNITED STATES PATENT AND TRADEMARK OFFICE
CERTIFICATE OF CORRECTION

| | | |
|---|---|---|
| PATENT NO. | : 9,462,673 B2 | Page 1 of 1 |
| APPLICATION NO. | : 14/570080 | |
| DATED | : October 4, 2016 | |
| INVENTOR(S) | : Zhang et al. | |

It is certified that error appears in the above-identified patent and that said Letters Patent is hereby corrected as shown below:

TITLE PAGE
Column 2; (74) Attorney, Agent or Firm should read:
(74) Attorney, Agent or Firm - Conley Rose, P.C.; Grant Rodolph Signed and Sealed this
Twentieth Day of December, 2016

Michelle K. Lee
*Director of the United States Patent and Trademark Office*